United States Patent [19]

Bersin et al.

[11] 4,127,437
[45] Nov. 28, 1978

[54] PROCESS FOR ETCHING SIO₂ UTILIZING HF VAPOR AND AN ORGANIC CATALYST

[75] Inventors: Richard L. Bersin, San Lorenzo; James H. Junkin, Hayward; Richard F. Reichelderfer, Castro Valley, all of Calif.

[73] Assignee: Dionex Corporation, Hayward, Calif.

[21] Appl. No.: 829,930

[22] Filed: Sep. 1, 1977

Related U.S. Application Data

[63] Continuation-in-part of Ser. No. 686,373, May 14, 1976, abandoned.

[51] Int. Cl.² .......................................... H01L 21/308
[52] U.S. Cl. .................................... 156/635; 96/36; 156/646; 156/657; 156/659; 156/661; 252/79.1; 427/331; 427/385 R
[58] Field of Search ........... 427/331, 340, 344, 372 R, 427/385 R; 156/628, 635, 646, 657, 643, 659, 661; 96/36; 252/79.1

[56] References Cited

U.S. PATENT DOCUMENTS

| | | | |
|---|---|---|---|
| 3,471,291 | 10/1969 | Schaefer | 156/635 |
| 3,494,768 | 2/1970 | Schaefer | 156/635 |
| 3,520,687 | 7/1970 | Schaefer | 96/36 |
| 3,535,137 | 10/1970 | Haller et al. | 427/385 R |
| 3,615,956 | 10/1971 | Irving et al. | 156/643 |
| 3,867,216 | 2/1975 | Jacob | 252/79.1 |
| 3,935,117 | 1/1976 | Suzuki et al. | 96/36 |
| 3,960,559 | 6/1976 | Suzuki et al. | 96/36 |
| 3,992,208 | 11/1976 | Nagata et al. | 96/36 |

*Primary Examiner*—Jerome W. Massie
*Attorney, Agent, or Firm*—Flehr, Hohback, Test, Albritton & Herbert

[57] ABSTRACT

Process for etching SiO₂ with hydrogen fluoride gas, utilizing an organic material such as negative photoresist as a catalyst. In one embodiment, the negative photoresist is applied directly to the portions of the SiO₂ to be removed, and in another the negative photoresist is spaced away from the SiO₂. In some embodiments, positive photoresist is applied to the portions of the SiO₂ which are to be retained.

18 Claims, 8 Drawing Figures

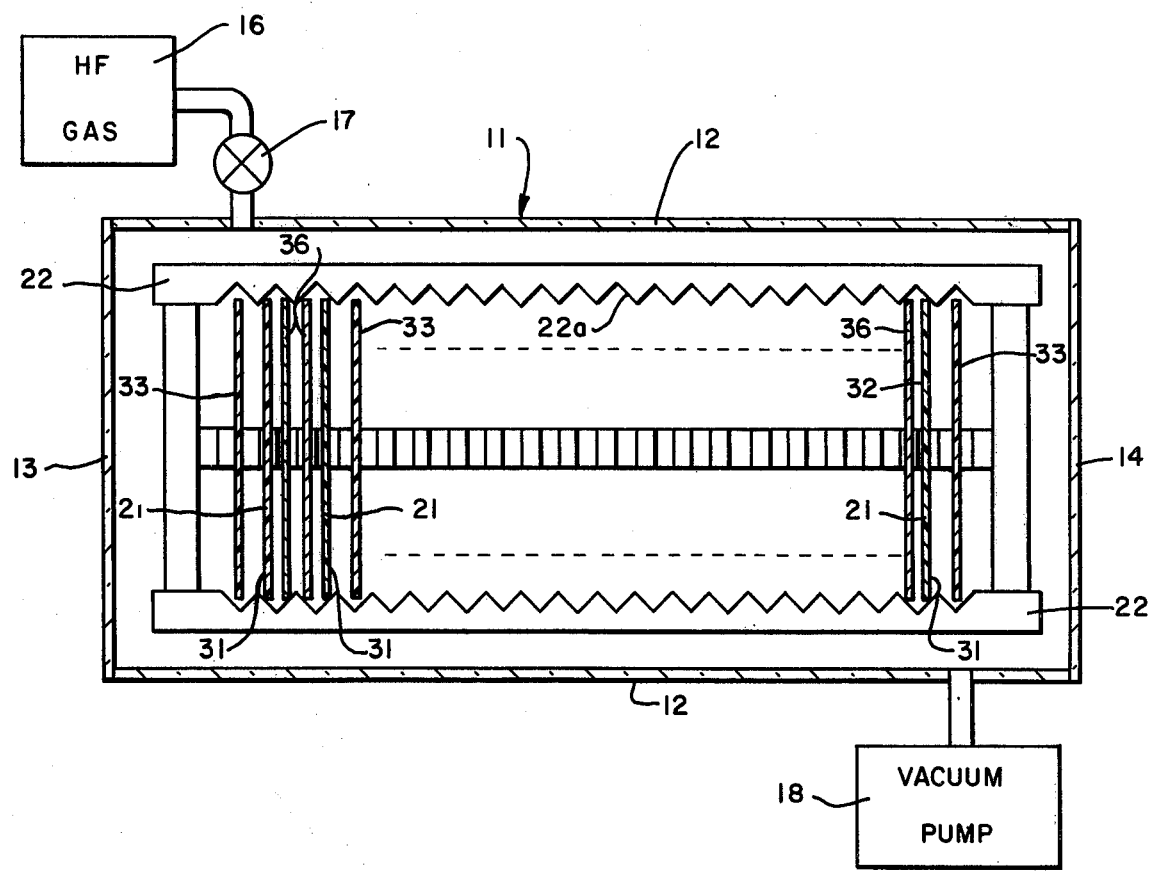
FIG.—1
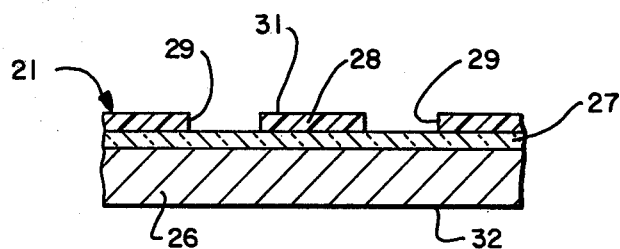
FIG.—2

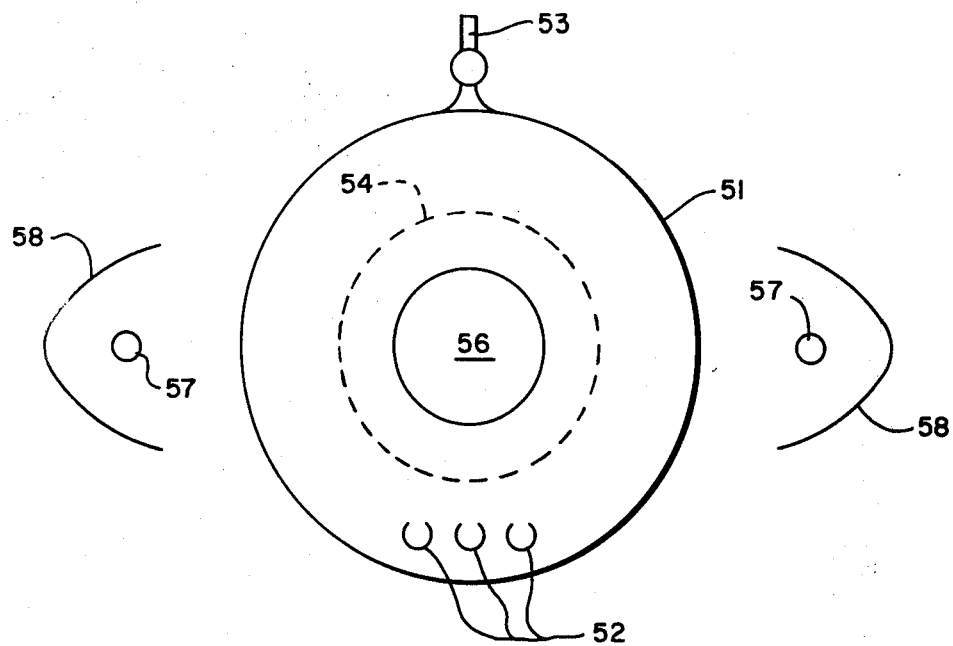
FIG.—3
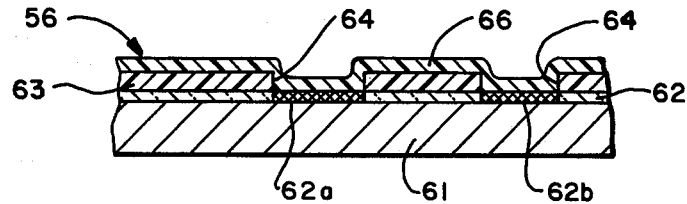
FIG.—4
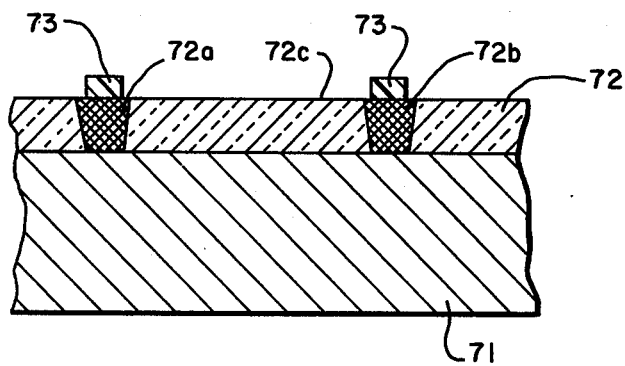
FIG.—5

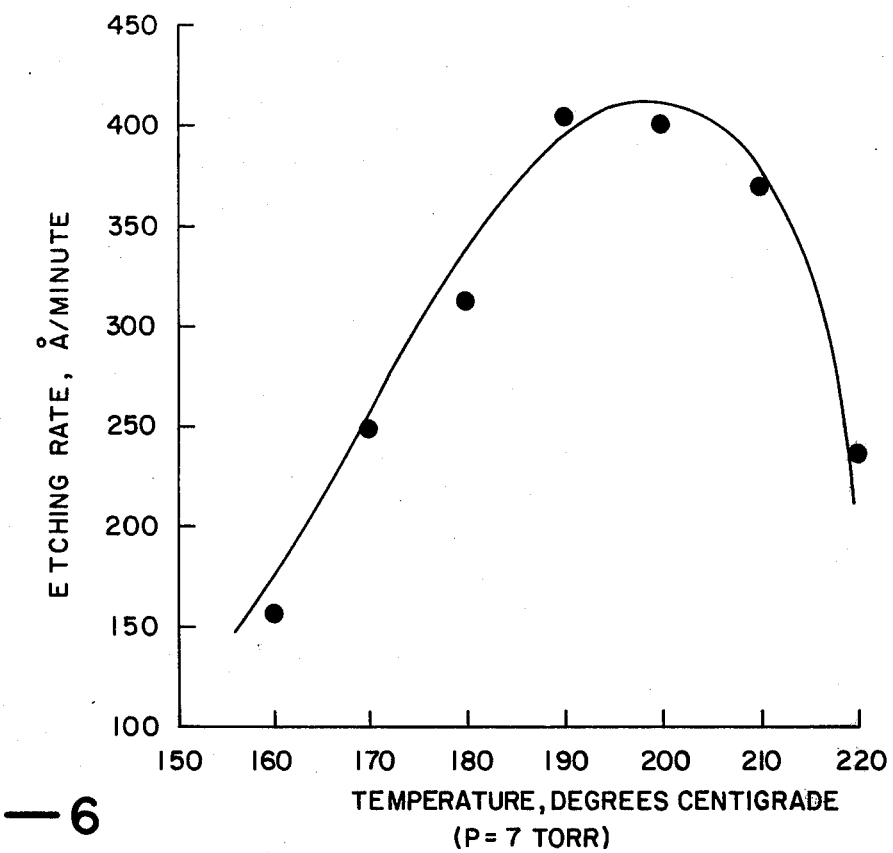
FIG.—6
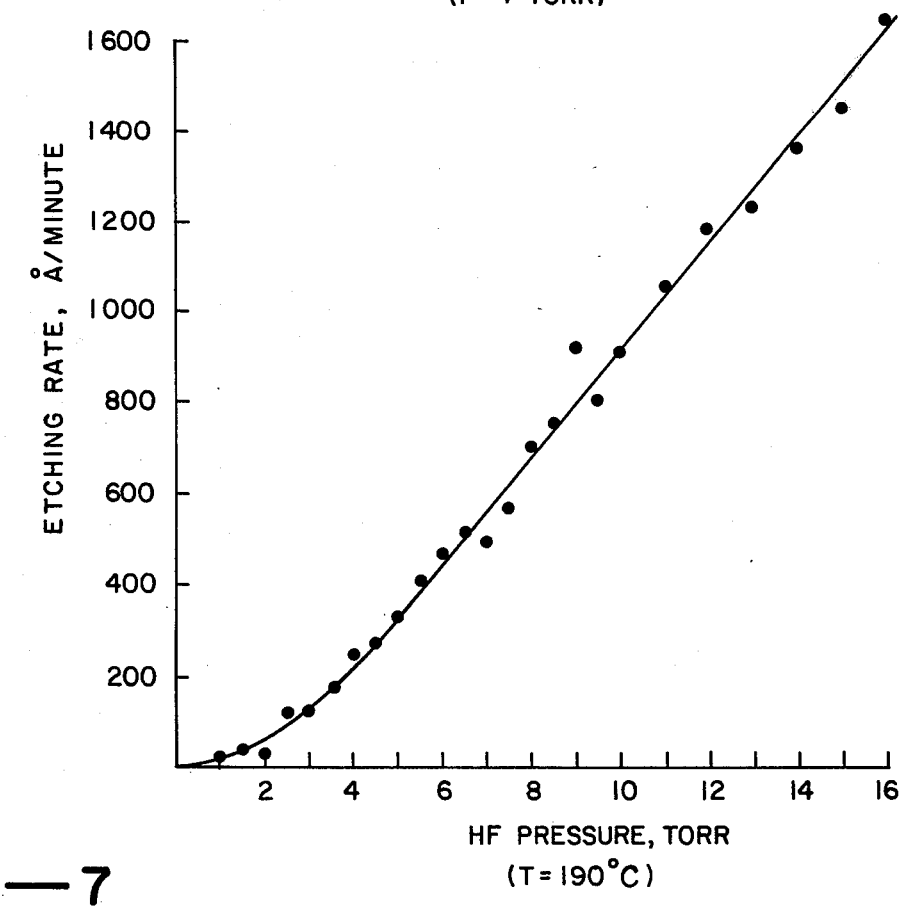
FIG.—7

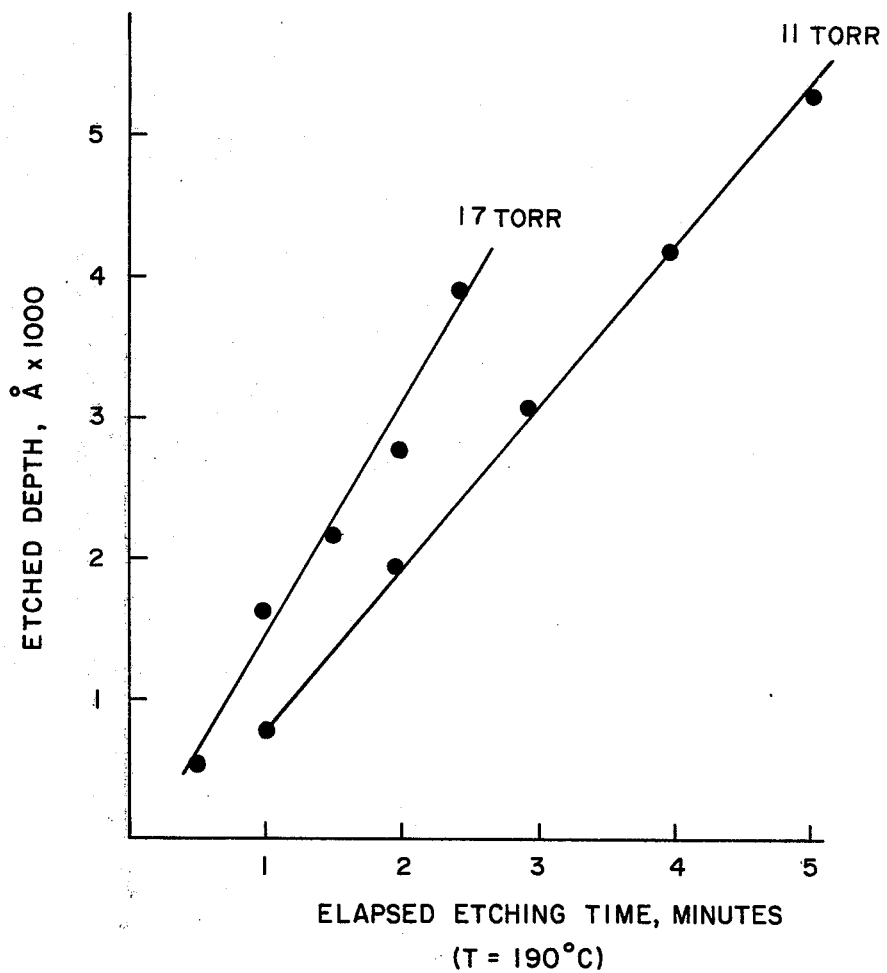
FIG.—8

PROCESS FOR ETCHING SIO₂ UTILIZING HF VAPOR AND AN ORGANIC CATALYST

RELATED APPLICATIONS

This application is a Continuation-In-Part of application Ser. No. 686,373, filed May 14, 1976, now abandoned.

BACKGROUND OF THE INVENTION

This invention pertains generally to selective etching techniques and more particularly to a process for removing silicon dioxide ($SiO_2$) from a semiconductor substrate.

$SiO_2$ is widely used in the manufacture of semiconductor devices to control the diffusion of impurities in selected areas on the surface of a silicon substrate. A pattern of $SiO_2$ is generally formed by first depositing or otherwise forming a layer of $SiO_2$ on a semiconductor substrate, then forming a mask of positive or negative photoresist on the $SiO_2$ layer, with windows exposing portions of the $SiO_2$ which are to be removed to leave the desired pattern. The exposed portions of the $SiO_2$ are then removed with a suitable etchant.

Etchants heretofore utilized for removing $SiO_2$, for example, hydrofluoride acid and nitric acid with a hydrofluoric buffer, have not provided satisfactory results from the standpoint of undercutting. Moreover, the acids are in liquid form and their use is therefore subject to the problems commonly attendant to wet chemical processes. There have been attempts to use hydrogen fluoride gas, but the results obtained with this gas have been erratic and unpredictable.

In addition, many finished semiconductor devices have a layer of $SiO_2$ overlying a silicon substrate, with metallic contacts extending through the $SiO_2$ layer to the substrate. The formation of contact openings in the $SiO_2$ layer without damaging the underlying substrate is a delicate process, which has been difficult to conrol with prior art techniques.

SUMMARY AND OBJECTS OF THE INVENTION

It has been found that organic materials such as negative photoresist can be utilized as catalysts in the etching of $SiO_2$ with hydrogen fluoride gas. Rather than functioning as a mask, the negative photoresist tends to concentrate the HF gas and provide greatly enhanced etching in the regions covered by the photoresist. The negative photoresist can either be applied directly to the wafer, with or without a positive photoresist mask overlying the areas of $SiO_2$ to be retained, or it can be applied to another wafer or surface in proximity to the surface to be etched.

It is in general an object of the invention to provide a new and improved process for etching the $SiO_2$ with hydrogen fluoride gas.

Another object of the invention is to provide a process of the above character in which a negative photoresist is utilized as a catalyst to enhance the etching of the $SiO_2$.

Another object of the invention is to provide a process of the above character in which the negative photoresist is applied directly to the areas of the $SiO_2$ to be removed.

Additional objects and features of the invention will be apparent from the following description in which the preferred embodiment is set forth in detail in conjunction with the accompanying drawings.

BRIEF DESCRIPTION OF THE DRAWINGS

FIG. 1 is a centerline sectional view, partially schematic, of one embodiment of apparatus for carrying out the invention.

FIG. 2 is an enlarged sectional view of a semiconductor wafer of the type processed in the apparatus of FIG. 1.

FIG. 3 is a cross-sectional view, largely schematic, of another embodiment of apparatus for carrying out the invention.

FIG. 4 is an enlarged sectional view of a semiconductor wafer prepared in accordance with the invention wherein negative photoresist is applied over a mask of positive photoresist.

FIG. 5 is an enlarged sectional view of a semiconductor wafer prepared in accordance with the invention wherein negative photoresist is applied directly to the areas of $SiO_2$ to be removed.

FIGS. 6–8 are graphical representations illustrating the relationship between etch rate, temperature and pressure in the process of the invention.

DESCRIPTION OF THE PREFERRED EMBODIMENTS

The apparatus illustrated in FIG. 1 includes a reaction chamber 11 which has a generally cylindrical side wall 12 and generally planar end walls 13, 14. The chamber walls are fabricated of a material, such as quartz, which is not attacked by the hydrogen fluoride gas etchant. A suitable closure (not shown) is provided to permit access to the interior of the chamber.

Hydrogen fluoride gas is supplied to the chamber from a tank 16 through a valve 17, and a vacuum pump 18 provides means for exhausting gas from the chamber.

Semiconductor wafers 21 are stacked in a boat 22 in a manner described hereinafter for processing in chamber 11. As illustrated in FIG. 2, each of the wafers includes a generally planar substrate 26 of semiconductor material such as silicon. A layer of $SiO_2$ 27 is formed on the surface of the substrate, and a layer of positive photoresist 28 is formed over the $SiO_2$. Suitable photoresists for this purpose include Shipley AZ 1350, Kodak positive resist, Tokyo Ohka OFPR, and other positive photoresists containing phenol-formaldehyde polymers. Windows 29 are formed in the photoresist layer in a known manner to expose portions of the $SiO_2$ which are to be removed. The side of the water on which the photoresist is formed can be referred to as the front of the wafer, designated by the reference numeral 31, and the substrate side can be referred to as the back side, designated by the reference numeral 32.

It has been observed that silicon dioxide, whether thermally grown or formed by chemical vapor deposition, responds variably to hydrogen fluoride gas. Some oxides are etched rapidly, some are etched slowly, and some are not etched at all. The most important factor affecting the response of a particular oxide to HF gas is the amount of water or hydroxyl groups on the surface of the oxide. Most thermal oxides are very day, and they resist etching. Most CVD oxides are relatively wet, and HF can etch them well.

It has been found that any $SiO_2$, wet or dry, can be etched rapidly by HF if the etching is done in the presence of polystyrene, polyethylene or other compounds that contain carbon and hydrogen but no oxygen. These compounds serve to activate the dioxide and make it susceptible to HF. Negative photoresist is an excellent carbon/hydrogen source for activating the SiO$_2$. Positive photoresist is ineffective for this purpose, because it contains a substantial amount of oxygen. Suitable negative photoresists include commercially available products such as Kodak KMER, Kodak KTER, Waycoat IC, and Kodak 747, and hydrocarbons containing olefinic groups have been found to give particularly goods results. In the embodiment of FIG. 1, the negative photoresist is provided in the form of a layer of coating on a wafer 33 positioned near the wafer from which the SiO$_2$ is to be removed.

It has also been found that unformity of the etch can be enhanced by placing a metal backing behind the SiO$_2$ to be etched. This is conveniently done by placing a thin disk of aluminum in contact with the back side of the wafer.

In the process of the invention, as carried out with the apparatus of FIG. 1, wafers 21 are loaded into boat 22 in alternate slots, with wafers 33 coated with negative photoresist or other suitable organic material in the intermediate slots. The photoresist or other organic material is positioned in facing relationship with the SiO$_2$ to be removed, and a spacing between the surfaces on the order of 3/16 inch has been found to give satisfactory results. Aluminum disks 36 are placed in the slots in contact with the back sides 32 of the wafers. The capacity of the boat can be increased by placing two wafers in each slot, with a single aluminum disk backing both wafers.

After the boat is loaded and placed in the chamber, the chamber is closed and vacuum pump 18 is actuated to reduce the pressure in the chamber to an initial level on the order of 0.1 torr or less. The chamber is heated to a suitable temperature, for example 170° C–190° C, by suitable means (not shown) such as a resistance heater adjacent to the side wall of the chamber. With pump 18 still running, valve 17 is opened to admit hydrogen fluoride gas into the chamber at a sufficient rate to raise the pressure in the chamber to a suitable level, for example 3–7 torr. The flowing gas passes between the confronting surfaces of the wafers and etches the exposed portions of the silicon dioxide layers.

The gas flow is maintained for a time sufficient to remove the exposed SiO$_2$, following which valve 17 is closed, pump 18 is closed off, the pressure within the chamber is brought up to atmospheric pressure, and the etched wafers are removed from the chamber.

EXAMPLE

Utilizing the process described above, with the photoresists specified, a SiO$_2$ layer having a thickness on the order of 8,000 Å has been removed in approximately 7 minutes with no appreciable permeation of the positive photoresist or etching under that photoresist. This process was effected at a temperature of 180° C, an initial pressure less than 0.1 torr, and a pressure during the etching process on the order of 6 torr. The confronting surfaces of the wafers were spaced 3/16 inch apart, and an aluminum disk was positioned adjacent to the back side of each wafer. When the photoresist was removed from the SiO$_2$, the remaining SiO$_2$ was found to still be 8,000 Å thick.

It has been found that if the carbon/hydrogen source is a coating of negative photoresist on the surface of the SiO$_2$, the activation effect can be localized with great precision. The coated parts of the dioxide are etched rapidly, and while the uncoated areas may be attacked by the HF, the etching of these areas proceeds slowly. Any attack of the uncovered areas can be substantially eliminated by covering these areas with a mask of positive photoresist or by exposing them to a suitable plasma prior to etching with HF.

The apparatus illustrated in FIG. 3 includes a generally cylindrical reactor chamber 51 fabricated of a material, such as quartz, which is not attacked by hydrogen fluoride gas. A plurality of gas inlets 52 are provided toward the bottom of the chamber, and an exhaust port 53 is provided at the top of the chamber. A perforated aluminum cylinder is disposed coaxially of the chamber, and wafers 56 are placed within the cylinder for etching.

Means is provided for heating the wafers within the chamber. This means includes lamps 57 which generate heat in the form of infrared radiation and reflectors 58 which serve to direct the heat energy from the lamps to the wafers. In the embodiment illustrated, the lamps and reflectors are located externally of the reaction chamber, and gas inlets 52 are located between the chamber wall and cylinder 54.

In one preferred process utilizing the apparatus of FIG. 3, a semiconductor wafer is prepared in the manner illustrated in FIG. 4. The wafer includes a generally planar substrate 61 of semiconductor material such as silicon. A layer 62 of SiO$_2$ is formed on the surface of the substrate, and a layer of positive photoresist 63 is formed over the SiO$_2$. Windows 64 are formed in the photoresist layer in a known manner to expose portions 62a, 62b of the SiO$_2$ which are to be removed. A layer of negative photoresist is then applied over the photoresist and the exposed portions 62a, 62b of the SiO$_2$. The negative photoresist can be applied by a suitable technique such as spinning. The positive and negative photoresists can be any of the types heretofore specified in connection with the embodiment of FIG. 1.

Following the application of the negative photoresist, the wafers are placed in the reaction chamber which is heated to a temperature on the order of 150° C–200° C by radiation from lamps 57. Hydrogen fluoride gas is introduced into the chamber through inlets 52 and exhausted through an exhaust port 53. The gas passes through the perforations in cylinder 54 and penetrates through the negative photoresist and etches away the SiO$_2$ beneath windows 64. The positive photoresist protects the SiO$_2$ which it covers, and these portions of the SiO$_2$ are not affected by the hydrogen fluoride gas. As noted before, the negative photoresist serves as a catalyst and provides substantially faster and more reliable etching of the SiO$_2$ than would occur with direct exposure of the SiO$_2$ to the hydrogen fluoride gas.

If the positive photoresist is allowed to stand on the SiO$_2$ for more than a few minutes, it has a tendency to depolymerize somewhat and dissolve into the negative photoresist, producing a region at the boundry where it is difficult to etch the SiO$_2$ completely. This problem can be eliminated by heating the positive photoresist to repolymerize it before the negative photoresist is applied. Heating the positive photoresist at a temperature on the order of 120° C for 30 minutes has been found to eliminate the solubility of the resist and provide clean etching all the way to the edge of the window.

It has also been found that SiO$_2$ can be etched in a desired pattern with hydrogen fluoride gas simply by applying negative photoresist in the areas to be removed, with no masking of the remaining areas. This process is best described with reference to FIG. 5 in which a layer 72 of SiO$_2$ is formed on the surface of a semiconductor substrate 71. Negative photoresist 73 or another suitable hydrocarbon is then applied to the portions of the SiO$_2$ layer 72a, 72b which are to be removed. Suitable resists include any of the negative resists heretofore specified in conjunction with the other embodiments.

It has been found that exposing the surface 72c of the SiO$_2$ to a plasma prior to etching will render the exposed portions of the SiO$_2$ substantially invulnerable of HF vapors. This conditioning can be carried out in the reaction chamber 51 by introducing a suitable gas through inlets 52 and ionizing the gas to form a plasma within the chamber. Suitable gases include freon 14, oxygen, argon and the like.

Following the exposure of surface 72c to the plasma, the plasma forming gas is exhausted from the chamber. Thereafter, the substrates are heated and the hydrogen fluoride gas is introduced. This gas is concentrated by the negative photoresist and etches away the portions of the SiO$_2$ covered by the resist.

Utilizing the foregoing process, an appropriate negative photoresist pattern is applied to a wafer. The photoresist covers the regions to be etched, while the rest of the SiO$_2$ remains uncovered. The wafer is exposed for about 30 seconds to a plasma of CF$_4$ and oxygen. This plasma inactivates the uncoated portions of the SiO$_2$. The wafer is then etched with anhydrous HF at a pressure on the order of 7-20 torr and a temperature on the order of 190° C. FIGS. 6-8 illustrate the etching rates which can be achieved with this process. When the desired amount of SiO$_2$ has been removed, the photoresist is stripped by exposing the wafer to a suitable plasma such as a mixture of CF$_4$ and oxygen or oxygen alone.

While anhydrous HF can etch SiO$_2$ under negative photoresist at temperatures below 100° C, higher temperatures have been found to provide better localization of the etching and are preferred. At lower temperatures, the HF tends to diffuse through the photoresist and react with the dioxide to form SiF$_4$ and water. This water remains on the etched surface and dissolves more HF. The resulting hydrofluoric acid leaks from under the photoresist and undermines uncoated parts of the wafer. At the higher temperatures, the water cannot linger on the dioxide surface to form aqueous acid. The water is vaporized as quickly as it is formed, and uncoated parts of the dioxide are safe from attack.

As illustrated in FIG. 5, the openings formed beneath the negative photoresist in the absence of positive photoresist tend to be bevelled or tapered, being wider at surface 72c than at the surface of the substrate. This tapering is believed to be due to the strong catalytic effect of the negative photoresist which is in closer proximity to the upper portions of the openings. This tapering is particularly advantageous for openings formed for electrical contacts which extend through the SiO$_2$ layer to the substrate. The tapered openings have larger wall areas than straight openings, and the aluminum or other contact material can make a better bond with the walls.

The invention has a number of important features and advantages. The negative photoresist or other organic catalyist substantially enhances the etching of the SiO$_2$ and results in a rapid and reliable process for etching SiO$_2$ with hydrogen fluoride gas.

It is apparent from the foregoing that a new and improved process for etching SiO$_2$ has been provided. While only the presently preferred embodiments have been described, as will be apparent to those familiar with the art, certain changes and modifications can be made without departing from the scope of the invention as defined by the following claims.

What is claimed is:

1. In a process for removing SiO$_2$ from a substrate member, the steps of: placing an organic catalyst containing hydrogen and carbon but substantially no oxygen in in direct contact with the surface of the SiO$_2$ to be removed, and exposing the catalyst to hydrogen fluoride gas which permeates through the catalyst for a time sufficient to remove the SiO$_2$.

2. The process of claim 1 wherein the organic catalyst is a negative photoresist.

3. The process of claim 1 further including the step of exposing portions of the SiO$_2$ not covered by the organic catalyst to a gas plasma to condition said portions to resist etching by the hydrogen fluoride gas.

4. The process of claim 1 further including the step of applying positive photoresist over portions of the SiO$_2$ to be retained, the organic catalyst being applied over the positive photoresist and the portions of the SiO$_2$ to be removed.

5. The process of claim 1 further including the step of placing a metal backing behind the substrate member.

6. The process of claim 1 wherein the substrate is placed in a chamber heated to a temperature on the order of 150° C–200° C.

7. The process of claim 1 wherein the removal of SiO$_2$ is effected at a pressure on the order of 3-7 torr.

8. In a process for removing SiO$_2$ from a substrate member, the steps of disposing an organic catalyst containing hydrogen and carbon but substantially no oxygen spaced from and generally parallel to the surface of the SiO$_2$ and exposing the SiO$_2$ to hydrogen fluoride gas for a time sufficient to remove the SiO$_2$.

9. The process of claim 8 wherein the organic catalyst is a negative photoresist.

10. The process of claim 8 further including the step placing a metal backing behind the substrate.

11. The process of claim 8 wherein the substrate is placed in a chamber heated to a temperature on the order of 150° C–200° C.

12. The process of claim 8 wherein the removal of SiO$_2$ is effected at a pressure on the order of 3-7 Torr.

13. In a process for removing SiO$_2$ from a substrate member in a chamber, the steps of: placing negative photoresist over the portions of the SiO$_2$ to be removed, heating the chamber to a temperature on the order of 150° C.–200° C., and exposing the SiO$_2$ to hydrogen fluoride gas for a time sufficient to remove the SiO$_2$ beneath the photoresist.

14. The process of claim 13 including the additional step of exposing the SiO$_2$ to a gas plasma to condition the portion of the SiO$_2$ not covered by the negative photoresist to resist etching by the hydrogen fluoride gas.

15. In a process for removing SiO$_2$ from a substrate member in a chamber, the steps of: providing a mask of positive photoresist over a portion of the SiO$_2$ which is to be retained, applying a layer of negative photoresist over a portion of the SiO$_2$ which is to be removed, heating the chamber to a temperature on the order of 150° C.–200° C. and exposing the structure to hydrogen fluoride gas to effect etching of the portion of the SiO$_2$ in direct contact with the negative photoresist.

16. The process of claim 15 further including the step of heating the positive photoresist to a predetermined temperature to repolymerize the same prior to the application of the negative photoresist layer.

17. In a process for producing a predetermined pattern of SiO$_2$ on a semiconductor wafer, the steps of: forming a layer of SiO$_2$ on a semiconductor substrate, providing a mask of positive photoresist over the SiO$_2$ layer with windows exposing portions of the SiO$_2$ to be removed to form the pattern, placing a layer of negative photoresist in facing relationship with the exposed portions of the SiO$_2$ and spaced therefrom, and introducing hydrogen fluoride gas into the space between the layer of negative photoresist and the SiO$_2$ to effect etching of the exposed portions of the SiO$_2$.

18. The process of claim 17 wherein a metal plate is positioned behind the substrate during the etching.

* * * * *